US009818459B2

(12) United States Patent
Hush

(10) Patent No.: US 9,818,459 B2
(45) Date of Patent: Nov. 14, 2017

(54) INVERT OPERATIONS USING SENSING CIRCUITRY

(71) Applicant: Micron Technology, Inc., Boise, ID (US)

(72) Inventor: Glen E. Hush, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 2 days.

(21) Appl. No.: 15/132,929

(22) Filed: Apr. 19, 2016

(65) Prior Publication Data

US 2017/0301379 A1 Oct. 19, 2017

(51) Int. Cl.
*G11C 7/00* (2006.01)
*G11C 7/10* (2006.01)
*G11C 7/22* (2006.01)

(52) U.S. Cl.
CPC .............. *G11C 7/10* (2013.01); *G11C 7/1051* (2013.01); *G11C 7/1078* (2013.01); *G11C 7/22* (2013.01)

(58) Field of Classification Search
CPC ........ G11C 7/1051; G11C 7/1078; G11C 7/22
USPC .......................... 365/189.05, 189.15, 230.03
See application file for complete search history.

(56) References Cited

U.S. PATENT DOCUMENTS

| 4,380,046 A | 4/1983 | Fung |
| 4,435,792 A | 3/1984 | Bechtolsheim |
| 4,435,793 A | 3/1984 | Ochii |
| 4,727,474 A | 2/1988 | Batcher |
| 4,843,264 A | 6/1989 | Galbraith |
| 4,958,378 A | 9/1990 | Bell |
| 4,977,542 A | 12/1990 | Matsuda et al. |
| 5,023,838 A | 6/1991 | Herbert |
| 5,034,636 A | 7/1991 | Reis et al. |
| 5,201,039 A | 4/1993 | Sakamura |
| 5,210,850 A | 5/1993 | Kelly et al. |
| 5,253,308 A | 10/1993 | Johnson |
| 5,276,643 A | 1/1994 | Hoffman et al. |
| 5,325,519 A | 6/1994 | Long et al. |
| 5,367,488 A | 11/1994 | An |
| 5,379,257 A | 1/1995 | Matsumura et al. |
| 5,386,379 A | 1/1995 | Ali-Yahia et al. |

(Continued)

FOREIGN PATENT DOCUMENTS

| CN | 102141905 | 8/2011 |
| EP | 0214718 | 3/1987 |

(Continued)

OTHER PUBLICATIONS

"4.9.3 MINLOC and MAXLOC", Jun. 12, 1995, (5pgs.), Message Passing Interface Forum 1.1, retrieved from http://www.mpi-forum.org/docs/mpi-1.1/mpi-11-html/node79.html.

(Continued)

*Primary Examiner* — Connie Yoha
(74) *Attorney, Agent, or Firm* — Brooks, Cameron & Huebsch, PLLC

(57) ABSTRACT

The present disclosure includes apparatuses and methods related to performing logical operations using sensing circuitry. An example apparatus comprises an array of memory cells and sensing circuitry coupled to the array. The sensing circuitry includes a plurality of sensing components coupled to a controller. The controller is configured to selectively activate a first control line and a second control line to invert signals stored on a latch.

30 Claims, 4 Drawing Sheets

(56) References Cited

U.S. PATENT DOCUMENTS

| | | |
|---|---|---|
| 5,398,213 A | 3/1995 | Yeon et al. |
| 5,440,482 A | 8/1995 | Davis |
| 5,446,690 A | 8/1995 | Tanaka et al. |
| 5,473,576 A | 12/1995 | Matsui |
| 5,481,500 A | 1/1996 | Reohr et al. |
| 5,485,373 A | 1/1996 | Davis et al. |
| 5,506,811 A | 4/1996 | McLaury |
| 5,615,404 A | 3/1997 | Knoll et al. |
| 5,638,128 A | 6/1997 | Hoogenboom |
| 5,638,317 A | 6/1997 | Tran |
| 5,654,936 A | 8/1997 | Cho |
| 5,678,021 A | 10/1997 | Pawate et al. |
| 5,724,291 A | 3/1998 | Matano |
| 5,724,366 A | 3/1998 | Furutani |
| 5,751,987 A | 5/1998 | Mahant-Shetti et al. |
| 5,787,458 A | 7/1998 | Miwa |
| 5,854,636 A | 12/1998 | Watanabe et al. |
| 5,867,429 A | 2/1999 | Chen et al. |
| 5,870,504 A | 2/1999 | Nemoto et al. |
| 5,915,084 A | 6/1999 | Wendell |
| 5,935,263 A | 8/1999 | Keeth et al. |
| 5,986,942 A | 11/1999 | Sugibayashi |
| 5,991,209 A | 11/1999 | Chow |
| 5,991,785 A | 11/1999 | Alidina et al. |
| 6,005,799 A | 12/1999 | Rao |
| 6,009,020 A | 12/1999 | Nagata |
| 6,092,186 A | 7/2000 | Betker et al. |
| 6,122,211 A | 9/2000 | Morgan et al. |
| 6,125,071 A | 9/2000 | Kohno et al. |
| 6,134,164 A | 10/2000 | Lattimore et al. |
| 6,147,514 A | 11/2000 | Shiratake |
| 6,151,244 A | 11/2000 | Fujino et al. |
| 6,157,578 A | 12/2000 | Brady |
| 6,163,862 A | 12/2000 | Adams et al. |
| 6,166,942 A | 12/2000 | Vo et al. |
| 6,172,918 B1 | 1/2001 | Hidaka |
| 6,175,514 B1 | 1/2001 | Henderson |
| 6,181,698 B1 | 1/2001 | Hariguchi |
| 6,208,544 B1 | 3/2001 | Beadle et al. |
| 6,226,215 B1 | 5/2001 | Yoon |
| 6,301,153 B1 | 10/2001 | Takeuchi et al. |
| 6,301,164 B1 | 10/2001 | Manning et al. |
| 6,304,477 B1 | 10/2001 | Naji |
| 6,389,507 B1 | 5/2002 | Sherman |
| 6,418,498 B1 | 7/2002 | Martwick |
| 6,466,499 B1 | 10/2002 | Blodgett |
| 6,510,098 B1 | 1/2003 | Taylor |
| 6,553,556 B1 * | 4/2003 | Blodgett ............... G11C 29/02 365/230.03 |
| 6,563,754 B1 | 5/2003 | Lien et al. |
| 6,578,058 B1 | 6/2003 | Nygaard |
| 6,731,542 B1 | 5/2004 | Le et al. |
| 6,754,746 B1 | 6/2004 | Leung et al. |
| 6,768,679 B1 | 7/2004 | Le et al. |
| 6,807,614 B2 | 10/2004 | Chung |
| 6,816,422 B2 | 11/2004 | Hamade et al. |
| 6,819,612 B1 | 11/2004 | Achter |
| 6,894,549 B2 | 5/2005 | Eliason |
| 6,943,579 B1 | 9/2005 | Hazanchuk et al. |
| 6,948,056 B1 | 9/2005 | Roth |
| 6,950,771 B1 | 9/2005 | Fan et al. |
| 6,950,898 B2 | 9/2005 | Merritt et al. |
| 6,956,770 B2 | 10/2005 | Khalid et al. |
| 6,961,272 B2 | 11/2005 | Schreck |
| 6,965,648 B1 | 11/2005 | Smith et al. |
| 6,985,394 B2 | 1/2006 | Kim |
| 6,987,693 B2 | 1/2006 | Cernea et al. |
| 7,020,017 B2 | 3/2006 | Chen et al. |
| 7,028,170 B2 | 4/2006 | Saulsbury |
| 7,045,834 B2 | 5/2006 | Tran et al. |
| 7,054,178 B1 | 5/2006 | Shiah et al. |
| 7,061,817 B2 | 6/2006 | Raad et al. |
| 7,079,407 B1 | 7/2006 | Dimitrelis |
| 7,173,857 B2 | 2/2007 | Kato et al. |
| 7,187,585 B2 | 3/2007 | Li et al. |
| 7,196,928 B2 | 3/2007 | Chen |
| 7,260,565 B2 | 8/2007 | Lee et al. |
| 7,260,672 B2 | 8/2007 | Garney |
| 7,372,715 B2 | 5/2008 | Han |
| 7,400,532 B2 | 7/2008 | Aritome |
| 7,406,494 B2 | 7/2008 | Magee |
| 7,447,720 B2 | 11/2008 | Beaumont |
| 7,454,451 B2 | 11/2008 | Beaumont |
| 7,457,181 B2 | 11/2008 | Lee et al. |
| 7,535,769 B2 | 5/2009 | Cernea |
| 7,546,438 B2 | 6/2009 | Chung |
| 7,562,198 B2 | 7/2009 | Noda et al. |
| 7,574,466 B2 | 8/2009 | Beaumont |
| 7,602,647 B2 | 10/2009 | Li et al. |
| 7,663,928 B2 | 2/2010 | Tsai et al. |
| 7,685,365 B2 | 3/2010 | Rajwar et al. |
| 7,692,466 B2 | 4/2010 | Ahmadi |
| 7,752,417 B2 | 7/2010 | Manczak et al. |
| 7,791,962 B2 | 9/2010 | Noda et al. |
| 7,796,453 B2 | 9/2010 | Riho et al. |
| 7,805,587 B1 | 9/2010 | Van Dyke et al. |
| 7,808,854 B2 | 10/2010 | Takase |
| 7,827,372 B2 | 11/2010 | Bink et al. |
| 7,869,273 B2 | 1/2011 | Lee et al. |
| 7,898,864 B2 | 3/2011 | Dong |
| 7,924,628 B2 | 4/2011 | Danon et al. |
| 7,937,535 B2 | 5/2011 | Ozer et al. |
| 7,957,206 B2 | 6/2011 | Bauser |
| 7,979,667 B2 | 7/2011 | Allen et al. |
| 7,996,749 B2 | 8/2011 | Ding et al. |
| 8,042,082 B2 | 10/2011 | Solomon |
| 8,045,391 B2 | 10/2011 | Mokhlesi |
| 8,059,438 B2 | 11/2011 | Chang et al. |
| 8,095,825 B2 | 1/2012 | Hirotsu et al. |
| 8,117,462 B2 | 2/2012 | Snapp et al. |
| 8,164,942 B2 | 4/2012 | Gebara et al. |
| 8,208,328 B2 | 6/2012 | Hong |
| 8,213,248 B2 | 7/2012 | Moon et al. |
| 8,223,568 B2 | 7/2012 | Seo |
| 8,238,173 B2 | 8/2012 | Akerib et al. |
| 8,274,841 B2 | 9/2012 | Shimano et al. |
| 8,279,683 B2 | 10/2012 | Klein |
| 8,310,884 B2 | 11/2012 | Iwai et al. |
| 8,332,367 B2 | 12/2012 | Bhattacherjee et al. |
| 8,339,824 B2 | 12/2012 | Cooke |
| 8,339,883 B2 | 12/2012 | Yu et al. |
| 8,347,154 B2 | 1/2013 | Bahali et al. |
| 8,351,292 B2 | 1/2013 | Matano |
| 8,356,144 B2 | 1/2013 | Hessel et al. |
| 8,417,921 B2 | 4/2013 | Gonion et al. |
| 8,462,532 B1 | 6/2013 | Argyres |
| 8,484,276 B2 | 7/2013 | Carlson et al. |
| 8,495,438 B2 | 7/2013 | Roine |
| 8,503,250 B2 | 8/2013 | Demone |
| 8,526,239 B2 | 9/2013 | Kim |
| 8,533,245 B1 | 9/2013 | Cheung |
| 8,555,037 B2 | 10/2013 | Gonion |
| 8,599,613 B2 | 12/2013 | Abiko et al. |
| 8,605,015 B2 | 12/2013 | Guttag et al. |
| 8,625,376 B2 | 1/2014 | Jung et al. |
| 8,644,101 B2 | 2/2014 | Jun et al. |
| 8,650,232 B2 | 2/2014 | Stortz et al. |
| 8,873,272 B2 | 10/2014 | Lee |
| 8,964,496 B2 | 2/2015 | Manning |
| 8,971,124 B1 | 3/2015 | Manning |
| 9,015,390 B2 | 4/2015 | Klein |
| 9,047,193 B2 | 6/2015 | Lin et al. |
| 9,165,023 B2 | 10/2015 | Moskovich et al. |
| 2001/0007112 A1 | 7/2001 | Porterfield |
| 2001/0008492 A1 | 7/2001 | Higashiho |
| 2001/0010057 A1 | 7/2001 | Yamada |
| 2001/0028584 A1 | 10/2001 | Nakayama et al. |
| 2001/0043089 A1 | 11/2001 | Forbes et al. |
| 2002/0059355 A1 | 5/2002 | Peleg et al. |
| 2003/0167426 A1 | 9/2003 | Slobodnik |
| 2003/0222879 A1 | 12/2003 | Lin et al. |
| 2004/0073592 A1 | 4/2004 | Kim et al. |
| 2004/0073773 A1 | 4/2004 | Demjanenko |
| 2004/0085840 A1 | 5/2004 | Vali et al. |

(56) References Cited

U.S. PATENT DOCUMENTS

| | | |
|---|---|---|
| 2004/0095826 A1 | 5/2004 | Perner |
| 2004/0154002 A1 | 8/2004 | Ball et al. |
| 2004/0205289 A1 | 10/2004 | Srinivasan |
| 2004/0240251 A1 | 12/2004 | Nozawa et al. |
| 2005/0015557 A1 | 1/2005 | Wang et al. |
| 2005/0078514 A1 | 4/2005 | Scheuerlein et al. |
| 2005/0097417 A1 | 5/2005 | Agrawal et al. |
| 2006/0047937 A1 | 3/2006 | Selvaggi et al. |
| 2006/0069849 A1 | 3/2006 | Rudelic |
| 2006/0146623 A1 | 7/2006 | Mizuno et al. |
| 2006/0149804 A1 | 7/2006 | Luick et al. |
| 2006/0181917 A1 | 8/2006 | Kang et al. |
| 2006/0215432 A1 | 9/2006 | Wickeraad et al. |
| 2006/0225072 A1 | 10/2006 | Lari et al. |
| 2006/0291282 A1 | 12/2006 | Liu et al. |
| 2007/0103986 A1 | 5/2007 | Chen |
| 2007/0171747 A1 | 7/2007 | Hunter et al. |
| 2007/0180006 A1 | 8/2007 | Gyoten et al. |
| 2007/0180184 A1 | 8/2007 | Sakashita et al. |
| 2007/0195602 A1 | 8/2007 | Fong et al. |
| 2007/0285131 A1 | 12/2007 | Sohn |
| 2007/0285979 A1 | 12/2007 | Turner |
| 2007/0291532 A1 | 12/2007 | Tsuji |
| 2008/0025073 A1 | 1/2008 | Arsovski |
| 2008/0037333 A1 | 2/2008 | Kim et al. |
| 2008/0052711 A1 | 2/2008 | Forin et al. |
| 2008/0137388 A1 | 6/2008 | Krishnan et al. |
| 2008/0165601 A1 | 7/2008 | Matick et al. |
| 2008/0178053 A1 | 7/2008 | Gorman et al. |
| 2008/0215937 A1 | 9/2008 | Dreibelbis et al. |
| 2009/0067218 A1 | 3/2009 | Graber |
| 2009/0154238 A1 | 6/2009 | Lee |
| 2009/0154273 A1 | 6/2009 | Borot et al. |
| 2009/0254697 A1 | 10/2009 | Akerib |
| 2010/0067296 A1 | 3/2010 | Li |
| 2010/0091582 A1 | 4/2010 | Vali et al. |
| 2010/0172190 A1 | 7/2010 | Lavi et al. |
| 2010/0210076 A1 | 8/2010 | Gruber et al. |
| 2010/0226183 A1 | 9/2010 | Kim |
| 2010/0308858 A1 | 12/2010 | Noda et al. |
| 2010/0332895 A1 | 12/2010 | Billing et al. |
| 2011/0051523 A1 | 3/2011 | Manabe et al. |
| 2011/0063919 A1 | 3/2011 | Chandrasekhar et al. |
| 2011/0093662 A1 | 4/2011 | Walker et al. |
| 2011/0103151 A1 | 5/2011 | Kim et al. |
| 2011/0119467 A1 | 5/2011 | Cadambi et al. |
| 2011/0122695 A1 | 5/2011 | Li et al. |
| 2011/0140741 A1 | 6/2011 | Zerbe et al. |
| 2011/0219260 A1 | 9/2011 | Nobunaga et al. |
| 2011/0267883 A1 | 11/2011 | Lee et al. |
| 2011/0317496 A1 | 12/2011 | Bunce et al. |
| 2012/0005397 A1 | 1/2012 | Lim et al. |
| 2012/0017039 A1 | 1/2012 | Margetts |
| 2012/0023281 A1 | 1/2012 | Kawasaki et al. |
| 2012/0120705 A1 | 5/2012 | Mitsubori et al. |
| 2012/0134216 A1 | 5/2012 | Singh |
| 2012/0134226 A1 | 5/2012 | Chow |
| 2012/0140540 A1 | 6/2012 | Agam et al. |
| 2012/0182798 A1 | 7/2012 | Hosono et al. |
| 2012/0195146 A1 | 8/2012 | Jun et al. |
| 2012/0198310 A1 | 8/2012 | Tran et al. |
| 2012/0246380 A1 | 9/2012 | Akerib et al. |
| 2012/0265964 A1 | 10/2012 | Murata et al. |
| 2012/0281486 A1 | 11/2012 | Rao et al. |
| 2012/0303627 A1 | 11/2012 | Keeton et al. |
| 2013/0003467 A1 | 1/2013 | Klein |
| 2013/0061006 A1 | 3/2013 | Hein |
| 2013/0107623 A1 | 5/2013 | Kavalipurapu et al. |
| 2013/0117541 A1 | 5/2013 | Choquette et al. |
| 2013/0124783 A1 | 5/2013 | Yoon et al. |
| 2013/0132702 A1 | 5/2013 | Patel et al. |
| 2013/0138646 A1 | 5/2013 | Sirer et al. |
| 2013/0163362 A1 | 6/2013 | Kim |
| 2013/0173888 A1 | 7/2013 | Hansen et al. |
| 2013/0205114 A1 | 8/2013 | Badam et al. |
| 2013/0219112 A1 | 8/2013 | Okin et al. |
| 2013/0227361 A1 | 8/2013 | Bowers et al. |
| 2013/0283122 A1 | 10/2013 | Anholt et al. |
| 2013/0286705 A1 | 10/2013 | Grover et al. |
| 2013/0326154 A1 | 12/2013 | Haswell |
| 2013/0332707 A1 | 12/2013 | Gueron et al. |
| 2014/0185395 A1 | 7/2014 | Seo |
| 2014/0215185 A1 | 7/2014 | Danielsen |
| 2014/0250279 A1 | 9/2014 | Manning |
| 2014/0344934 A1 | 11/2014 | Jorgensen |
| 2015/0029798 A1 | 1/2015 | Manning |
| 2015/0042380 A1 | 2/2015 | Manning |
| 2015/0063052 A1 | 3/2015 | Manning |
| 2015/0078108 A1 | 3/2015 | Cowles et al. |
| 2015/0120987 A1 | 4/2015 | Wheeler |
| 2015/0134713 A1 | 5/2015 | Wheeler |
| 2015/0270015 A1 | 9/2015 | Murphy et al. |
| 2015/0279466 A1 | 10/2015 | Manning |
| 2015/0324290 A1 | 11/2015 | Leidel |
| 2015/0325272 A1 | 11/2015 | Murphy |
| 2015/0356009 A1 | 12/2015 | Wheeler et al. |
| 2015/0356022 A1 | 12/2015 | Leidel et al. |
| 2015/0357007 A1 | 12/2015 | Manning et al. |
| 2015/0357008 A1* | 12/2015 | Manning ............... G11C 7/08 365/189.15 |
| 2015/0357019 A1 | 12/2015 | Wheeler et al. |
| 2015/0357020 A1 | 12/2015 | Manning |
| 2015/0357021 A1 | 12/2015 | Hush |
| 2015/0357022 A1* | 12/2015 | Hush ............... G11C 11/4074 365/72 |
| 2015/0357023 A1 | 12/2015 | Hush |
| 2015/0357024 A1 | 12/2015 | Hush et al. |
| 2015/0357047 A1 | 12/2015 | Tiwari |
| 2016/0062672 A1 | 3/2016 | Wheeler |
| 2016/0062673 A1 | 3/2016 | Tiwari |
| 2016/0062692 A1 | 3/2016 | Finkbeiner et al. |
| 2016/0062733 A1 | 3/2016 | Tiwari |
| 2016/0063284 A1 | 3/2016 | Tiwari |
| 2016/0064045 A1 | 3/2016 | La Fratta |
| 2016/0064047 A1 | 3/2016 | Tiwari |
| 2016/0098208 A1* | 4/2016 | Willcock ............... G06F 3/0608 711/165 |
| 2016/0098209 A1 | 4/2016 | Leidel et al. |

FOREIGN PATENT DOCUMENTS

| | | |
|---|---|---|
| EP | 2026209 | 2/2009 |
| JP | H0831168 | 2/1996 |
| JP | 2009259193 | 3/2015 |
| KR | 10-0211482 | 8/1998 |
| KR | 10-2010-0134235 | 12/2010 |
| KR | 10-2013-0049421 | 5/2013 |
| WO | 2001065359 | 9/2001 |
| WO | 2010079451 | 7/2010 |
| WO | 2013062596 | 5/2013 |
| WO | 2013081588 | 6/2013 |
| WO | 2013095592 | 6/2013 |

OTHER PUBLICATIONS

Stojmenovic, "Multiplicative Circulant Networks Topological Properties and Communication Algorithms", (25 pgs.), Discrete Applied Mathematics 77 (1997) 281-305.

Boyd et al., "On the General Applicability of Instruction-Set Randomization", Jul.-Sep. 2010, (14 pgs.), vol. 7, Issue 3, IEEE Transactions on Dependable and Secure Computing.

Dybdahl, et al., "Destructive-Read in Embedded DRAM, Impact on Power Consumption," Apr. 2006, (10 pgs.), vol. 2, Issue 2, Journal of Embedded Computing-Issues in embedded single-chip multicore architectures.

Kogge, et al., "Processing in Memory: Chips to Petaflops," May 23, 1997, (8 pgs.), retrieved from: http://www.cs.ucf.edu/courses/cda5106/summer02/papers/kogge97PIM.pdf.

Draper, et al., "The Architecture of the DIVA Processing-In-Memory Chip," Jun. 22-26, 2002, (12 pgs.), ICS '02, retrieved from: http://www.isi.edu/~draper/papers/ics02.pdf.

(56) References Cited

OTHER PUBLICATIONS

Adibi, et al., "Processing-In-Memory Technology for Knowledge Discovery Algorithms," Jun. 25, 2006, (10 pgs.), Proceeding of the Second International Workshop on Data Management on New Hardware, retrieved from: http://www.cs.cmu.edu/~damon2006/pdf/adibi06inmemory.pdf.
U.S. Appl. No. 13/449,082, entitled, "Methods and Apparatus for Pattern Matching," filed Apr. 17, 2012, (37 pgs).
U.S. Appl. No. 13/743,686, entitled, "Weighted Search and Compare in a Memory Device," filed Jan. 17, 2013, (25 pgs.).
U.S. Appl. No. 13/774,636, entitled, "Memory As a Programmable Logic Device," filed Feb. 22, 2013, (30 pgs.).
U.S. Appl. No. 13/774,553, entitled, "Neural Network in a Memory Device," filed Feb. 22, 2013, (63 pgs.).
U.S. Appl. No. 13/796,189, entitled, "Performing Complex Arithmetic Functions in a Memory Device," filed Mar. 12, 2013, (23 pgs.).
International Search Report and Written Opinion for PCT Application No. PCT/US2013/043702, dated Sep. 26, 2013, (11 pgs).
Pagiamtzis, et al., "Content-Addressable Memory (CAM) Circuits and Architectures: A Tutorial and Survey", Mar. 2006, (16 pgs.), vol. 41, No. 3, IEEE Journal of Solid-State Circuits.
Pagiamtzis, Kostas, "Content-Addressable Memory Introduction", Jun. 25, 2007, (6 pgs.), retrieved from: http:/www.pagiamtzis.com/cam/camintro.
Debnath, Biplob, Bloomflash: Bloom Filter on Flash-Based Storage, 2011 31st Annual Conference on Distributed computing Systems, Jun. 20-24, 2011, 10 pgs.
Derby, et al., "A High-Performance Embedded DSP Core with Novel SIMD Features", Apr. 6-10, 2003, (4 pgs), vol. 2, pp. 301-304, 2003 IEEE International Conference on Accoustics, Speech, and Signal Processing.
Elliot, et al., "Computational RAM: Implementing Processors in Memory", Jan.-Mar. 1999, (10 pgs.), vol. 16, Issue 1, IEEE Design and Test of Computers Magazine.

\* cited by examiner ive INVERT OPERATIONS USING SENSING CIRCUITRY

TECHNICAL FIELD

The present disclosure relates generally to semiconductor memory and methods, and more particularly, to apparatuses and methods related to performing invert operations using sensing circuitry.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Electronic systems often include a number of processing resources (e.g., one or more processors), which may retrieve and execute instructions and store the results of the executed instructions to a suitable location. A processor can comprise a number of functional units such as arithmetic logic unit (ALU) circuitry, floating point unit (FPU) circuitry, and/or a combinatorial logic block, for example, which can be used to execute instructions by performing logical operations such as AND, OR, NOT, NAND, NOR, and XOR, and invert (e.g., inversion) logical operations on data (e.g., one or more operands). For example, functional unit circuitry (FUC) may be used to perform arithmetic operations such as addition, subtraction, multiplication, and/or division on operands via a number of logical operations.

A number of components in an electronic system may be involved in providing instructions to the FUC for execution. The instructions may be generated, for instance, by a processing resource such as a controller and/or host processor. Data (e.g., the operands on which the instructions will be executed) may be stored in a memory array that is accessible by the FUC. The instructions and/or data may be retrieved from the memory array and sequenced and/or buffered before the FUC begins to execute instructions on the data. Furthermore, as different types of operations may be executed in one or multiple clock cycles through the FUC, intermediate results of the instructions and/or data may also be sequenced and/or buffered.

In many instances, the processing resources (e.g., processor and/or associated FUC) may be external to the memory array, and data is accessed via a bus between the processing resources and the memory array to execute a set of instructions. Processing performance may be improved in a processing-in-memory (PIM) device, in which a processor may be implemented internal and/or near to a memory (e.g., directly on a same chip as the memory array), which may conserve time and power in processing. However, such PIM devices may have various drawbacks such as an increased chip size. Moreover, such PIM devices may still consume undesirable amounts of power in association with performing logical operations (e.g., compute functions).

DETAILED DESCRIPTION

Figure 1:
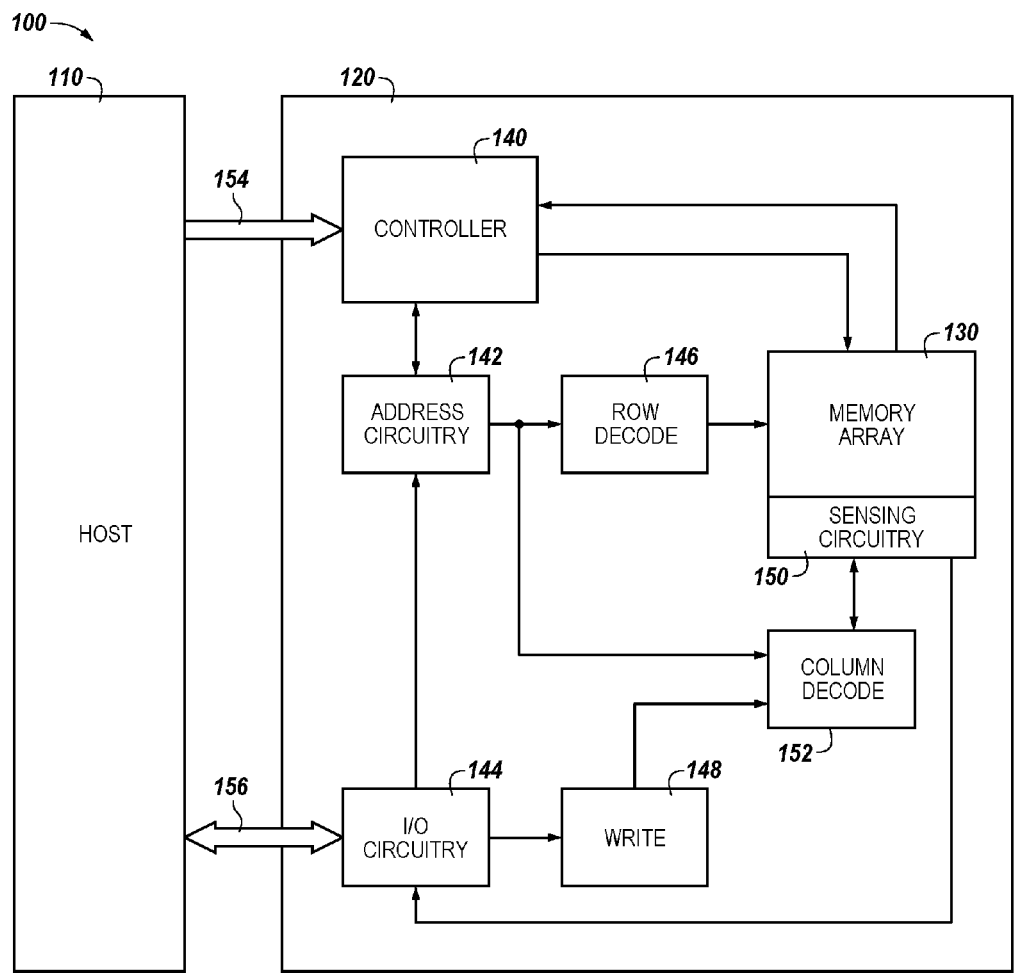
FIG. 1 is a block diagram of an apparatus in the form of a computing system including a memory device in accordance with a number of embodiments of the present disclosure.

The present disclosure includes apparatuses and methods related to performing logical operations using sensing circuitry. An example apparatus comprises an array of memory cells and sensing circuitry coupled to the array. The sensing circuitry includes a plurality of sensing components coupled to a controller. The controller is configured to selectively activate a first control line and a second control line to invert signals stored on a latch Sensing circuitry can include a number of transistors, such as a pair of isolation transistors coupled to an isolation control line and a pair of invert transistors coupled to an invert control line. The isolation transistors and the invert transistors can be configured to invert signals that are stored in a latch. The latch can be a sense amp latch and the signals can be inverted by the isolation transistors and invert transistors when a sense amp latch is in the latched state.

A number of embodiments of the present disclosure can provide improved parallelism and/or reduced power consumption in association with performing compute functions as compared to previous systems such as previous PIM systems and systems having an external processor (e.g., a processing resource located external from a memory array, such as on a separate integrated circuit chip). For instance, a number of embodiments can provide for performing fully complete compute functions such as integer add, subtract, multiply, divide, and CAM (content addressable memory) functions without transferring data out of the memory array and sensing circuitry via a bus (e.g., data bus, address bus, control bus), for instance. Such compute functions can involve performing a number of logical operations (e.g., logical functions such as AND, OR, NOT, NOR, NAND, XOR, etc.). However, embodiments are not limited to these examples. For instance, performing logical operations can include performing a number of non-Boolean logic operations such as copy, compare, destroy, etc.

In previous approaches, data may be transferred from the array and sensing circuitry (e.g., via a bus comprising input/output (I/O) lines) to a processing resource such as a processor, microprocessor, and/or compute engine, which may comprise ALU circuitry and/or other functional unit circuitry configured to perform the appropriate logical operations. However, transferring data from a memory array and sensing circuitry to such processing resource(s) can involve significant power consumption. Even if the processing resource is located on a same chip as the memory array, significant power can be consumed in moving data out of the array to the compute circuitry, which can involve performing a sense line (which may be referred to herein as a digit line or data line) address access (e.g., firing of a column decode signal) in order to transfer data from sense lines onto I/O lines (e.g., local I/O lines), moving the data to the array periphery, and providing the data to the compute function.

Furthermore, the circuitry of the processing resource(s) (e.g., compute engine) may not conform to pitch rules associated with a memory array. For example, the cells of a memory array may have a $4F^2$ or $6F^2$ cell size, where "F" is a feature size corresponding to the cells. As such, the devices (e.g., logic gates) associated with ALU circuitry of previous PIM systems may not be capable of being formed on pitch with the memory cells, which can affect chip size and/or memory density, for example. A number of embodiments of the present disclosure include sensing circuitry formed on pitch with memory cells of the array and capable of performing invert functions such as those described herein below.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designator "N," particularly with respect to reference numerals in the drawings, indicates that a number of the particular feature so designated can be included. As used herein, "a number of" a particular thing can refer to one or more of such things (e.g., a number of memory arrays can refer to one or more memory arrays).

The figures herein follow a numbering convention in which the first digit or digits correspond to the drawing figure number and the remaining digits identify an element or component in the drawing. Similar elements or components between different figures may be identified by the use of similar digits. For example, 206 may reference element "06" in FIG. 2, and a similar element may be referenced as 606 in FIG. 6. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense.

FIG. 1 is a block diagram of an apparatus in the form of a computing system 100 including a memory device 120 in accordance with a number of embodiments of the present disclosure. As used herein, a memory device 120, a memory array 130, and/or sensing circuitry 150 might also be separately considered an "apparatus."

System 100 includes a host 110 coupled to memory device 120, which includes a memory array 130. Host 110 can be a host system such as a personal laptop computer, a desktop computer, a digital camera, a mobile telephone, or a memory card reader, among various other types of hosts. Host 110 can include a system motherboard and/or backplane and can include a number of processing resources (e.g., one or more processors, microprocessors, or some other type of controlling circuitry). The system 100 can include separate integrated circuits or both the host 110 and the memory device 120 can be on the same integrated circuit. The system 100 can be, for instance, a server system and/or a high performance computing (HPC) system and/or a portion thereof. Although the example shown in FIG. 1 illustrates a system having a Von Neumann architecture, embodiments of the present disclosure can be implemented in non-Von Neumann architectures (e.g., a Turing machine), which may not include one or more components (e.g., CPU, ALU, etc.) often associated with a Von Neumann architecture.

For clarity, the system 100 has been simplified to focus on features with particular relevance to the present disclosure. The memory array 130 can be a DRAM array, SRAM array, STT RAM array, PCRAM array, TRAM array, RRAM array, NAND flash array, and/or NOR flash array, for instance. The array 130 can comprise memory cells arranged in rows coupled by access lines and columns coupled by sense lines (which may be referred to herein as digit lines or data lines). Although a single array 130 is shown in FIG. 1, embodiments are not so limited. For instance, memory device 120 may include a number of arrays 130 (e.g., a number of banks of DRAM cells). An example DRAM array is described in association with FIGS. 2A and 2B.

The memory device 120 includes address circuitry 142 to latch address signals provided over an I/O bus 156 (e.g., a data bus) through I/O circuitry 144. Address signals are received and decoded by a row decoder 146 and a column decoder 152 to access the memory array 130. Data can be read from memory array 130 by sensing voltage and/or current changes on the sense lines using sensing circuitry 150. The sensing circuitry 150 can read and latch a page (e.g., row) of data from the memory array 130. The I/O circuitry 144 can be used for bi-directional data communication with host 110 over the I/O bus 156. The write circuitry 148 is used to write data to the memory array 130.

Controller 140 decodes signals provided by control bus 154 from the host 110. These signals can include chip enable signals, write enable signals, and address latch signals that are used to control operations performed on the memory array 130, including data read, data write, and data erase operations. In various embodiments, the controller 140 is responsible for executing instructions from the host 110. The controller 140 can be a state machine, a sequencer, or some other type of controller.

An example of the sensing circuitry 150 is described further below in association with FIGS. 2A and 2B. For instance, in a number of embodiments, the sensing circuitry 150 can include a number of sensing components each of which can include a sense amplifier and/or a compute component. The sensing components may function as a latch serving as an accumulator and/or may be used to perform logical operations (e.g., on data associated with complementary sense lines). In a number of embodiments, the sensing circuitry 150 can be used to perform operations using data stored in array 130 as inputs and store the results of the operations back to the array 130 without transferring data via an I/O line and/or via a sense line address access (e.g., without firing a column decode signal). As such, operations can be performed using sensing circuitry 150 rather than and/or in addition to being performed by processing resources external to the sensing circuitry 150 (e.g., by a processor associated with host 110 and/or other processing circuitry, such as ALU circuitry, located on device 120 (e.g., on controller 140 or elsewhere)).

In various previous approaches, data associated with an operation, for instance, would be read from memory via sensing circuitry and provided to an external ALU. The external ALU circuitry would perform the operations using bit-vectors (which may be referred to as operands or inputs) and the result could be transferred back to the array via the local I/O lines. In contrast, in a number of embodiments of the present disclosure, sensing circuitry 150 is configured to selectively perform an operation on data stored in memory cells in memory array 130 and store the result back to the array 130 without activating a local I/O line coupled to the sensing circuitry.

As such, in a number of embodiments, registers and/or an ALU external to array 130 and sensing circuitry 150 may not be needed to perform the operation as the sensing circuitry 150 can be operated to perform the appropriate computations involved in performing the operation. Additionally, the operation can be performed without the use of an external processing resource.

Figure 2A:
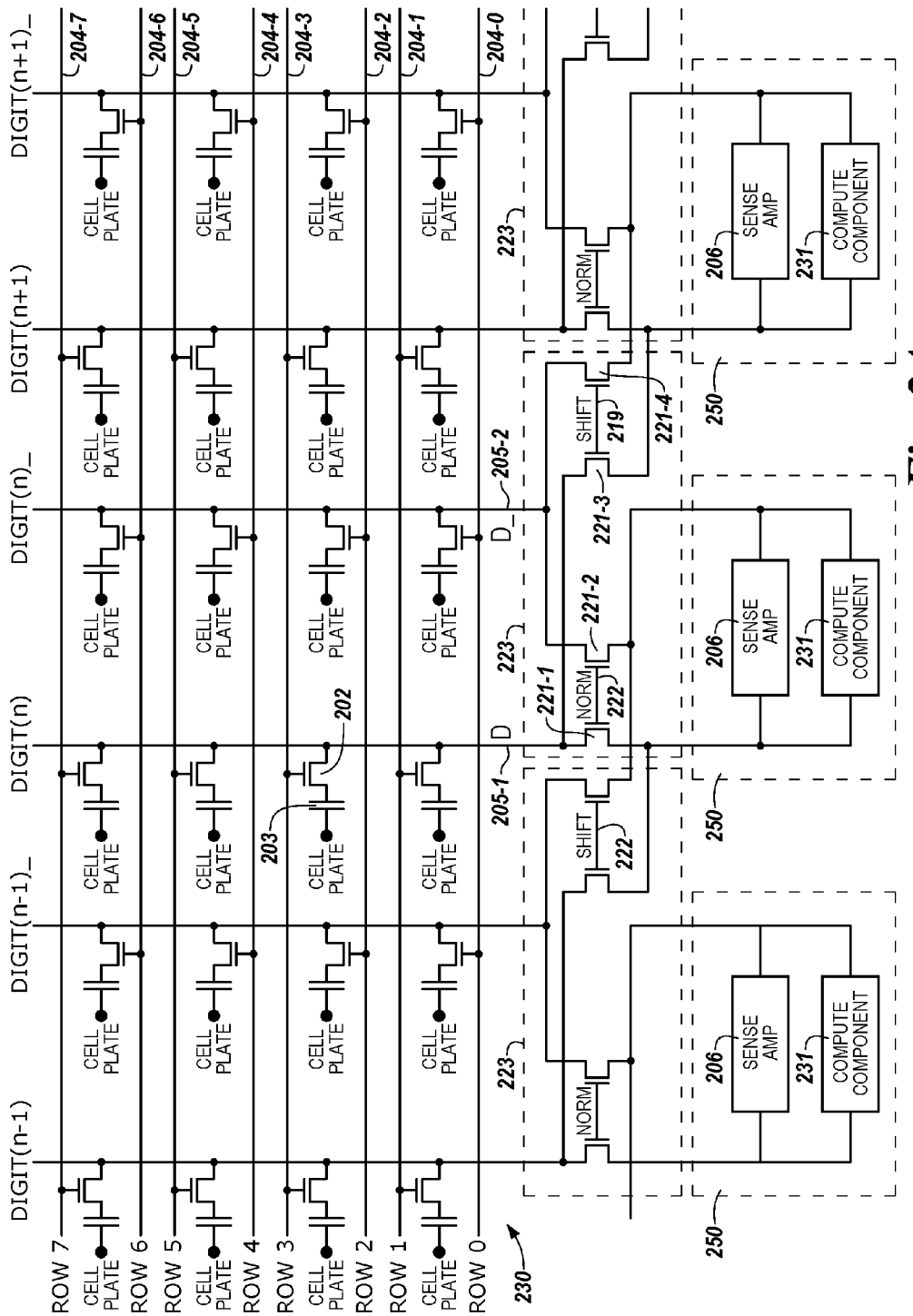
FIG. 2A is a schematic diagram illustrating memory cells and sensing circuitry in accordance with a number of embodiments of the present disclosure.

FIG. 2A is a schematic diagram illustrating sensing circuitry in accordance with a number of embodiments of the present disclosure. In this example, the memory array 230 is a DRAM array of 1T1C (one transistor one capacitor) memory cells each comprised of an access device 202 (e.g., transistor) and a storage element 203 (e.g., a capacitor). In a number of embodiments, the memory cells may be destructive read memory cells (e.g., reading the data stored in the cell destroys the data such that the data originally stored in the cell may be refreshed after being read). The cells of the memory array 230 are arranged in rows coupled by word lines 204-0 (Row 0), 204-1 (Row 1), etc. and columns coupled by pairs of complementary data lines DIGIT(n−1)/DIGIT(n−1)_, DIGIT(n)/DIGIT(n)_, DIGIT(n+1)/DIGIT(n+1)_. The individual data lines corresponding to each pair of complementary data lines can also be referred to as data lines 205-1 (D) and 205-2 (D_) respectively. Although only three pair of complementary data lines are shown in FIG. 2A, embodiments of the present disclosure are not so limited, and an array of memory cells can include additional columns of memory cells and/or data lines (e.g., 4,096, 8,192, 16,384, etc.).

As shown in FIG. 2A, a gate of a particular memory cell transistor 202 can be coupled to its corresponding word line 204-0, 204-1, ..., 204-7, etc. A first source/drain region can be coupled to its corresponding data line (e.g., 205-1 (D), 205-2 (D_)), and a second source/drain region of a particular memory cell transistor 202 can be coupled to its corresponding capacitor 203.

The memory array 230 is coupled to sensing circuitry 250 in accordance with a number of embodiments of the present disclosure. In this example, the sensing circuitry 250 comprises a sense amplifier 206 corresponding to respective columns of memory cells (e.g., coupled to respective pairs of complementary data lines 205-1 (D) and 205-2 (D_)) but may, or may not, additionally comprise a compute component. The sensing circuitry can correspond to sensing circuitry 150 shown in FIG. 1, for example.

In the example illustrated in FIG. 2A, the sensing circuitry 250 comprises a sense amplifier 206. An example configuration for sense amplifier 206 is described in detail with respect to FIG. 2B below. In a number of embodiments, a sense amplifier 206 (e.g., "sense amp") is provided for each column of memory cells in an array (e.g., array 130). The sense amplifier 206 can be sense amplifier of a DRAM array, for instance. In this example, sense amplifier 206 is coupled to a pair of complementary data lines 205-1 (D) and 205-2 (D_). As such, the sense amplifier 206 can be coupled to all of the memory cells in a respective column through data lines 205-1 (D) and 205-2 (D_).

As shown in FIG. 2A, sensing circuitry 250 can be coupled to the memory array 230 via shift circuitry 223. In this example, the shift circuitry 223 comprises a pair of isolation transistors 221-1 and 221-2 coupled intermediate within the data lines 205-1 (D) and 205-2 (D_). That is, a first source/drain region of isolation transistor 221-1 can be coupled to a first portion of data line 205-1 (D) and a second source/drain region of isolation transistor 221-1 can be coupled to a second portion of data line 205-1 (D). Isolation transistor 221-2 can be similarly coupled between portions of data line 205-2 (D_).

Gates of the isolation transistors 221-1 and 221-2 are coupled to a control signal line 222 providing a normal configuration control signal (e.g., "NORM") that, when activated, enables (e.g., turns on) the isolation transistors 221-1 and 221-2 to couple the corresponding sense amplifier 206 to a column of memory cells coupled to the pair of complementary data lines 205-1 (D) and 205-2 (D_). According to various embodiments, isolation transistors 221-1 and 221-2 coupling memory cells to a particular sense amplifier 206 can be referred to as a "normal" configuration of the shift circuitry 223. Isolation transistors 221-1 and 221-2 can be used when transferring data values to/from memory cells coupled to data lines 205-1 (D) and 205-2 (D_) and the corresponding sense amplifier 206 (e.g., coupled to the date lines 205-1 (D) and 205-2 (D_) via isolation transistors 221-1 and 221-2).

In the example illustrated in FIG. 2, the shift circuitry 223 also includes another (e.g., a second) pair of isolation transistors 221-3 and 221-4 coupled between a sense amplifier 206 and an adjacent pair of complementary data lines 205-1 (D) and 205-2 (D_). As shown in FIG. 2, isolation transistors 221-3 and 221-4 are configured to couple the pair of complementary data lines 205-1 (D) and 205-2 (D_) (e.g., DIGIT(n)/DIGIT(n)_ to an adjacent sense amplifier 206. Isolation transistors 221-3 and 221-4 may also be described as being configured to couple a sense amplifier 206 (e.g., corresponding to the pair of complementary data lines 205-1 (D) and 205-2 (D_) such as DIGIT(n)/DIGIT(n)_) to an adjacent pair of complementary data lines 205-1 (D) and 205-2 (D_)) (e.g., DIGIT(n−1)/DIGIT(n−1)_).

Isolation transistors 221-3 and 221-4 are configured to couple the adjacent pair of complementary data lines from one side of isolation transistors 221-1 and 221-2 (e.g., a portion of the adjacent pair of complementary data lines 205-1 (D) and 205-2 to which memory cells are coupled) to an opposite side of isolation transistors 221-1 and 221-2 of a different shift circuitry 223 coupled to the pair of complementary data lines 205-1 (D) and 205-2 (e.g., a portion of the pair of complementary data lines 205-1 (D) and 205-2 to which sense amplifier 206 is coupled). For example, isolation transistors 221-3 and 221-4 couple data lines Digit(n) and Digit (n)_ on the memory array 230 side of isolation transistors 221-1 and 221-2 to the sense amplifier 206 corresponding to data lines Digit(n+1) and Digit (n+1)_ (e.g., the right-most sense amplifier 206 shown in FIG. 2A). The gates of isolation transistors 221-3 and 221-4 can be coupled to a control signal line 219 providing a shift control signal (e.g., "SHIFT"), which can be activated, for example, when the NORM control signal 222 is deactivated.

This configuration facilitates shifting data right or left. To shift data right for example, data from memory cell coupled to data lines Digit(n) and Digit (n)_ can be communicated to the right-most sense amplifier 206 shown in FIG. 2 by turning-on shift isolation transistors 221-3 and 221-4 between the right-most sense amplifier 206 shown in FIG. 2 and data lines Digit(n+1) and Digit (n+1)_. The normal isolation transistors 221-1 and 221-2 between the center sense amplifier 206 shown in FIG. 2 and data lines Digit(n) and Digit (n)_ are turned-off, and the normal isolation transistors between the right-most sense amplifier 206 shown in FIG. 2 and data lines Digit(n+1) and Digit (n+1)_ are also turned-off. Firing the right-most sense amplifier shown in FIG. 2A can load the data from data lines Digit (n) and Digit (n)_ into the right-most sense amplifier shown in FIG. 2A.

This right-shifted data can subsequently be transferred to memory cells coupled to data lines Digit(n+1) and Digit (n+1)_ by turning-off shift isolation transistors 221-3 and 221-4 and turning-on the normal isolation transistors between the right-most sense amplifier shown in FIG. 2A and data lines Digit(n+1) and Digit (n+1)_.

To shift data left for example, data from a memory cell coupled to data lines Digit(n) and Digit (n)_ can first be communicated to the center sense amplifier 206 shown in FIG. 2 by turning-on the normal isolation transistors 221-1 and 221-2 between the center sense amplifier 206 shown in FIG. 2A and data lines Digit(n) and Digit (n)_, and subsequently firing the center sense amplifier 206 shown in FIG. 2 to load the data into the center sense amplifier 206 shown in FIG. 2A. The normal isolation transistors 221-1 and 221-2 between the center sense amplifier 206 shown in FIG. 2A and data lines Digit(n) and Digit (n)_ can be turned-off, and the shift isolation transistors between the center sense amplifier 206 shown in FIG. 2A and data lines Digit(n–1) and Digit (n–1)_ can be turned-on (with the normal isolation transistors between the left-most sense amplifier 206 shown in FIG. 2A and data lines Digit(n–1) and Digit (n–1)_ being turned-off). Data from the center sense amplifier 206 shown in FIG. 2A can be loaded into memory cells coupled to data lines Digit(n–1) and Digit (n–1)_ by enabling a desired row of memory cell coupled to data lines Digit(n–1) and Digit (n–1)_.

Although shift circuitry 223 shown in FIG. 2A is configured such that isolation transistors 221-3 and 221-4 couple a pair of complementary data lines 205-1 (D) and 205 (D_) to a right adjacent sense amplifier 206 (e.g., or coupled sense amplifier to a left adjacent pair of complementary data lines 205-1 (D) and 205-2 (D_)), embodiments of the present disclosure are not limited to the particular configuration illustrated in FIG. 2A. For instance, isolation transistors 221-3 and 221-4 can be configured to couple a pair of complementary data lines 205-1 (D) and 205-2 (D_) to a left adjacent sense amplifier 206 (e.g., or coupled a sense amplifier to a right adjacent pair of complementary data lines 205-1 (D) and 205 (D_)). In some embodiments, isolation transistors 221-3 and 221-4 can be configured to couple a pair of complementary data lines 205-1 (D) and 205-2 (D_) to a sense amplifier 206 that is non-adjacent (e.g., a different sense amplifier2 than to which isolation transistors 221-1 and 221-2 couple the pair of complementary data lines 205-1 (D) and 205-2 (D_)).

The shift circuitry 223 is effectively configured as a 2-to-1 multiplexer being able to couple a compute component 250 to one of two possible data line configurations (e.g., normal coupling to a corresponding pair of complementary data lines via a first pair of isolation transistors and shift coupling to an adjacent pair of complementary data lines via a second pair of isolation transistors).

Embodiments of the present disclosure are not limited to the configuration of shift circuitry 223 shown in FIG. 2A. In a number of embodiments, shift circuitry 223 such as that shown in FIG. 2A can be operated (e.g., in conjunction with sense amplifiers 206) in association with performing compute functions such as adding and subtracting functions without transferring data out of the sensing circuitry via an I/O line (e.g., local IO/IO_ lines), for instance.

Each column of memory cells can be coupled to a column decode line that can be enabled to transfer, via local I/O line, a data value from a corresponding sense amplifier 206 to a control component external to the array such as an external processing resource (e.g., host processor and/or other functional unit circuitry). For example, data lines 205-1 (D) and 205-2 (D_) can be coupled to respective local I/O lines that are responsive to an enabling signal to access transistors to perform an operation such as a data line access in association with a read operation. Such an enabling signal can be activated to transfer a signal corresponding to the state (e.g., a logic data value such as logic "0" or logic "1") of the memory cell being accessed out of the array on an I/O line to a secondary sense amplifier (SSA) and/or elsewhere off-pitch from the array 230.

Also, the column decode line can be coupled to a column decoder (e.g., column decoder 152 shown in FIG. 1). However, as described herein, in a number of embodiments, data need not be transferred via such I/O lines to perform logical operations in accordance with embodiments of the present disclosure. In a number of embodiments, shift circuitry 223 such as that shown in FIG. 2A can be operated (e.g., in conjunction with sense amplifiers 206) in performing compute functions such as adding and subtracting functions without transferring data to a control component external to the array, for instance.

The sense amplifier 206 can be operated to determine a data value (e.g., logic state) stored in a selected memory cell and/or represented by the voltages present on the complementary data lines 205-1 (D), 205-2 (D_). The sense amplifier 206 can also be utilizing in conjunction with the memory array 230 to perform operations, as is described with respect to FIG. 3.

Embodiments of sense amplifier 206 are not limited to the example shown in FIG. 2A. Sense amplifier 206 can be for example, a current-mode sense amplifier and/or single-ended sense amplifier (e.g., sense amplifier coupled to one data line). Also, embodiments of the present disclosure are not limited to a folded data line architecture. In a number of embodiments, the sense amplifier 206 can be operated to perform a logical operation using the equilibration circuitry, and/or in conjunction with invert circuitry, with the result being stored in a primary latch without transferring data from the sensing circuitry via an I/O line (e.g., without performing a data line address access via activation of a column decode signal, for instance).

Figure 2B:
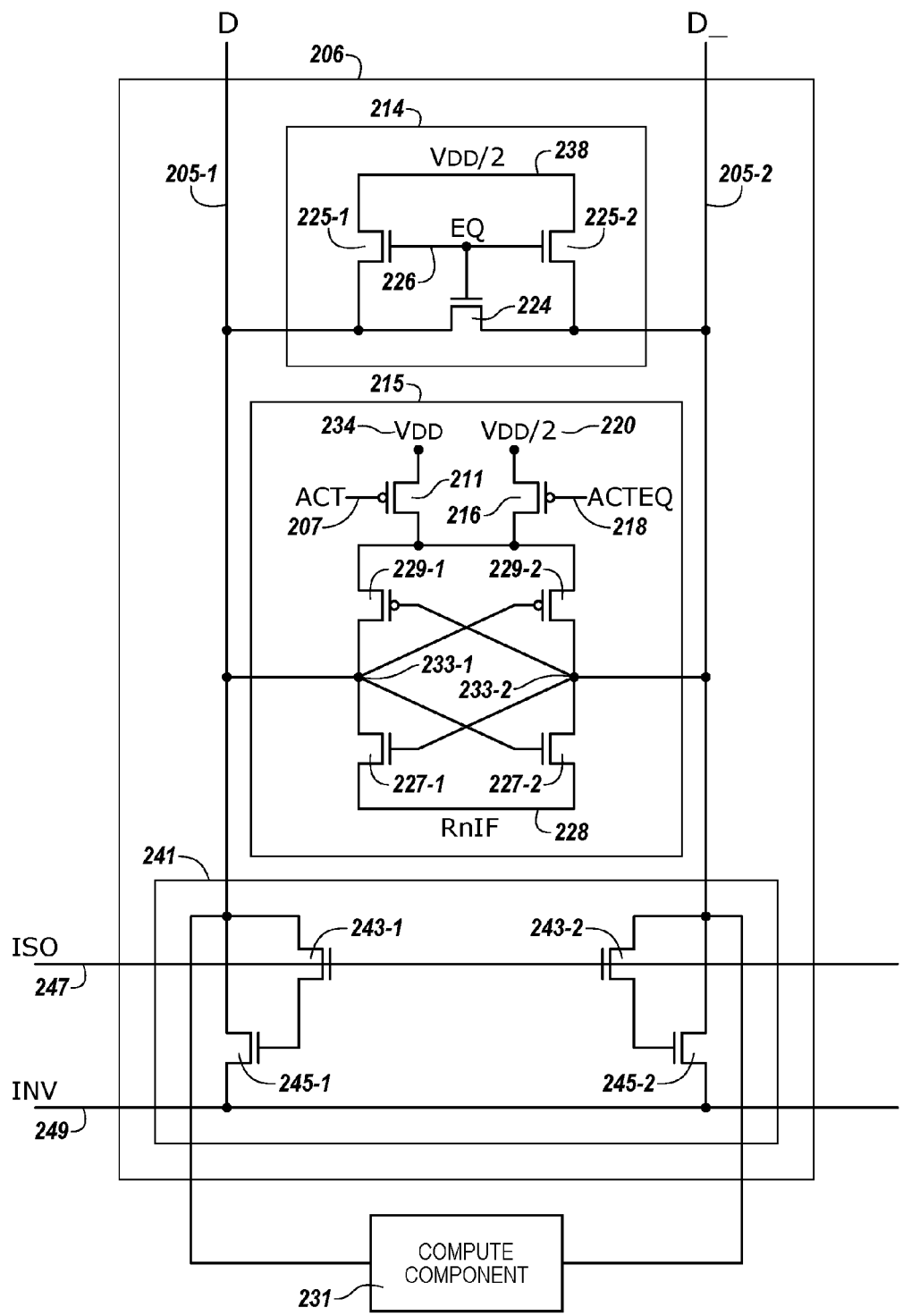
FIG. 2B is a schematic diagram illustrating a portion of sensing circuitry in accordance with a number of embodiments of the present disclosure.

FIG. 2B illustrates a schematic diagram of a portion of sensing circuitry in accordance with a number of embodiments of the present disclosure. In various embodiments, sense amplifier 206 can comprise a cross coupled latch. However, embodiments of the sense amplifier 206 are not limited to a cross coupled latch. As an example, the sense amplifier 206 in FIG. 2B can be a current-mode sense amplifier and/or a single-ended sense amplifier (e.g., sense amplifier coupled to one data line). Also, embodiments of the present disclosure are not limited to a folded data line architecture.

In a number of embodiments, a sense amplifier (e.g., 206) can comprise a number of transistors formed on pitch with the transistors of the corresponding compute component 231 and/or the memory cells of an array (e.g., 230 shown in FIG. 2A) to which they are coupled, which may conform to a particular feature size (e.g., $4F^2$, $6F^2$, etc.). Sense amplifier 206 comprises a latch 215 including four transistors coupled to a pair of complementary data lines D 205-1 and D_ 205-2. The latch 215 can be a cross coupled latch. That is, the gates of a pair of transistors, such as n-channel transistors (e.g., NMOS transistors) 227-1 and 227-2 are cross coupled with the gates of another pair of transistors, such as p-channel transistors (e.g., PMOS transistors) 229-1 and 229-2. As described further herein, the latch 215 comprising transistors 227-1, 227-2, 229-1, and 229-2 can be referred to as a primary latch. However, embodiments are not limited to this example.

The voltages and/or currents on the respective data lines D and D_ can be provided to the respective latch inputs 233-1 and 233-2 (e.g., nodes) of the cross coupled latch 215 (e.g., the input of the primary latch). In this example, the latch input 233-1 is coupled to a first source/drain region of transistors 227-1 and 229-1 as well as to the gates of transistors 227-2 and 229-2. Similarly, the latch input 233-2 can be coupled to a first source/drain region of transistors 227-2 and 229-2 as well as to the gates of transistors 227-1 and 229-1. The compute component 231, which may be referred to herein as an accumulator, can be coupled to latch inputs 233-1 and 233-2 of the cross coupled latch 215 as shown; however, embodiments are not limited to the example shown in FIG. 2B.

In this example, a second source/drain region of transistor 227-1 and 227-2 is commonly coupled to an RnIF 228. A second source/drain region of transistors 229-1 and 229-2 is commonly coupled to an ACT signal 207. The ACT signal 207 can be a supply voltage 234 (e.g., $V_{DD}$) and the RnIF signal 228 can be a reference voltage (e.g., ground). Activating signals 228 and 207 enables the cross coupled latch 215. The latch 215 can also include a pair of cross coupled p-channel transistors (e.g., PMOS transistors) 229-1 and 229-2 having their respective sources selectively coupled to a supply voltage 234e (e.g., $V_{DD}$) through a source transistor 211. Source transistor 211 can be a p-channel transistor (e.g., PMOS transistor), for example. A gate of the source transistor 211 can be coupled to a positive control signal line providing a positive control signal 207 (e.g., ACT). Cross coupled p-channel transistor 229-1 can have a drain directly coupled to latch input 233-1, and cross coupled p-channel transistor 629-2 can have a drain directly coupled to latch input 233-2.

The enabled cross coupled latch 215 operates to amplify a differential voltage between latch input 233-1 (e.g., first common node) and latch input 233-2 (e.g., second common node) such that latch input 233-1 is driven to one of the ACT signal voltage and the RnIF signal voltage (e.g., to one of $V_{DD}$ and ground), and latch input 233-2 is driven to the other of the ACT signal voltage and the RnIF signal voltage.

The sense amplifier 206 can also include circuitry configured to equilibrate the data lines D and D_ (e.g., in association with preparing the sense amplifier for a sensing operation). In this example, the equilibration circuitry 214 comprises a transistor 224 having a first source/drain region coupled to a first source/drain region of transistor 225-1 and data line D 205-1. A second source/drain region of transistor 224 can be coupled to a first source/drain region of transistor 225-2 and data line D_ 205-2. A gate of transistor 224 can be coupled to gates of transistors 225-1 and 225-2.

The second source drain regions of transistors 225-1 and 225-2 are coupled to an equilibration voltage 238 (e.g., $V_{DD}/2$), which can be equal to $V_{DD}/2$, where $V_{DD}$ is a supply voltage associated with the array. The gates of transistors 224, 225-1, and 225-2 can be coupled to control signal 226 (EQ). As such, activating EQ enables the transistors 224, 225-1, and 225-2, which effectively shorts data line D to data line D_ such that the data lines D and D_ are equilibrated to equilibration voltage $V_{DD}/2$. Alternatively, activation of an ACT equilibrate transistor 216 in response to an ACTEQ signal 218 will short the source regions for cross coupled p-channel transistors 629-1 and 629-2 to the equilibrate voltage (e.g., Vdd/2) 220. According to a number of embodiments of the present disclosure, a number of logical operations can be performed using the sense amplifier 206 and compute component 231, and the result can be stored in the sense amplifier and/or compute component.

The sense amplifier 206 can include circuitry configured to invert the data stored latch 215. Sense amplifier 206 comprises invert circuitry 241 including four transistors 243-1, 243-2, 245-1, and 245-2 coupled to a pair of complementary data lines D 205-1 and D_ 205-2. Transistors 243-1 and 243-2 can be isolation transistors having their gates coupled to isolation line 247. Transistor 245-1 and 245-2 can be invert transistors having their gates coupled to a source/drain region of transistors 243-1 and 243-2.

The sensing circuitry 250 in FIGS. 2A and 2B can be operated in several modes to perform logical operations, including a first mode in which a result of the logical operation is initially stored in the sense amplifier 206, and a second mode in which a result of the logical operation is initially stored in the compute component 231. Additionally with respect to the first operating mode, sensing circuitry 250-2 can be operated in both pre-sensing (e.g., sense amplifiers fired before logical operation control signal active) and post-sensing (e.g., sense amplifiers fired after logical operation control signal active) modes with a result of a logical operation being initially stored in the sense amplifier 206.

As described further below, the sense amplifier 206 can, in conjunction with the compute component 231, be operated to perform various logical operations using data from an array as input. In a number of embodiments, the result of a logical operation can be stored back to the array without transferring the data via a data line address access (e.g., without firing a column decode signal such that data is transferred to circuitry external to the array and sensing circuitry via local I/O lines). As such, a number of embodiments of the present disclosure can enable performing various operations (e.g., logical operations, mathematical operations, etc.) using less power than various previous approaches. Additionally, since a number of embodiments eliminate the need to transfer data across I/O lines in order to perform operations (e.g., between memory and discrete processor), a number of embodiments can enable an increased parallel processing capability as compared to previous approaches.

Figure 3:
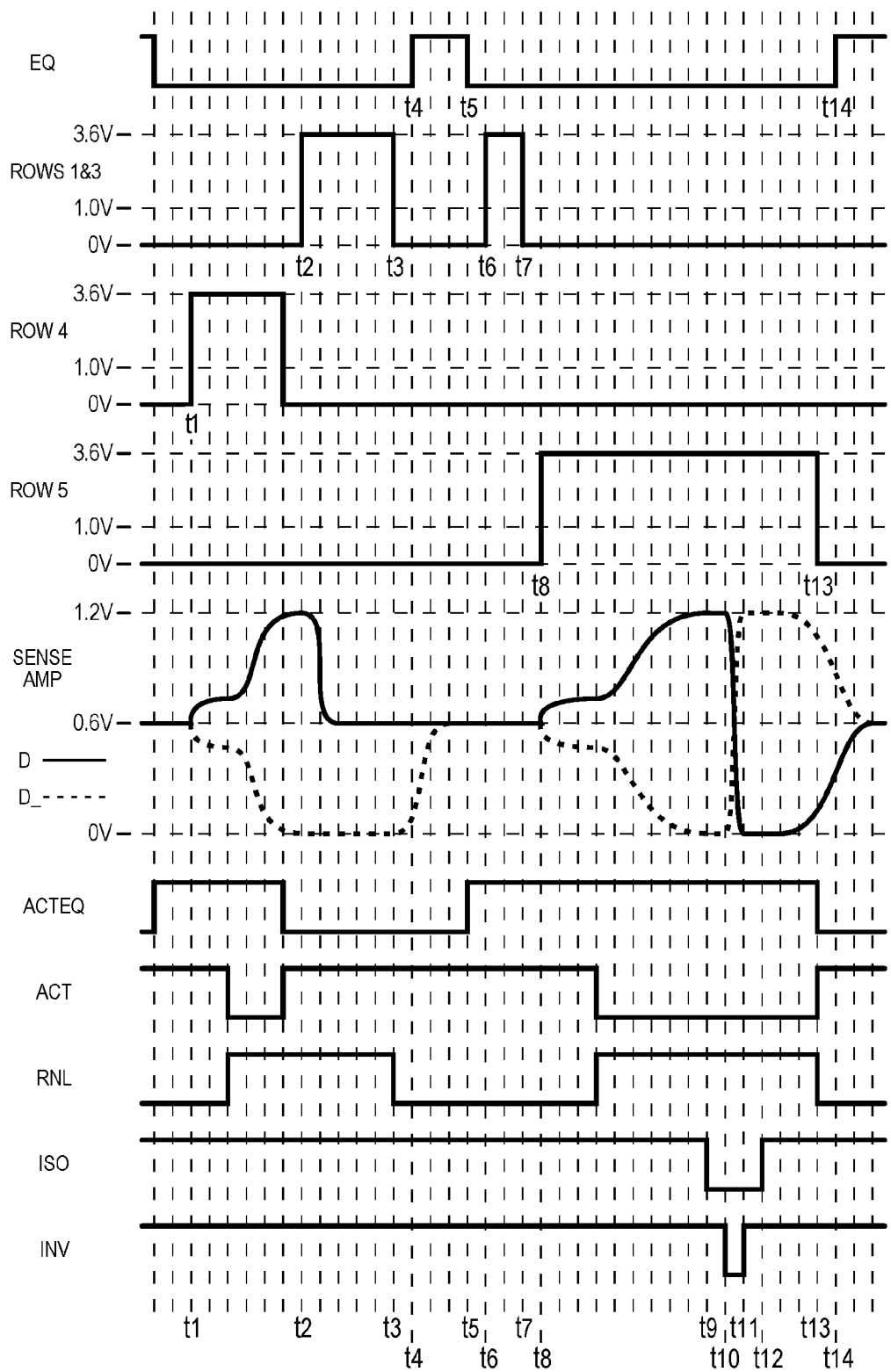
FIG. 3 illustrates a timing diagram associated with performing a number of logical operations using sensing circuitry in accordance with a number of embodiments of the present disclosure.

FIG. 3 illustrates a timing diagram associated with initiating an AND logical operation and inverting the result of the AND logical operation using the sense amplifier 206 shown in FIG. 2. The invert circuitry 241 in FIG. 2B can be used to invert signals stored in a latch. The latch can be the cross-coupled latch in FIG. 2B, among other types of latches. The example illustrated in FIG. 3 is one example of inverting signals stored in a latch, such as latch 215 in FIG. 2B. FIG. 3 shows signals for various rows Rows 1, 3 (operated together in this example), 4, and 5 and control lines ISO and INV. However, implementation of the present methodology is not limited to operation of these particular rows and control lines and can be implemented using different rows and control lines. The particular timing diagram signals are discussed below with respect to the pseudo code associated with inverting the results of an AND operation of the circuit shown in FIGS. 2A and 2B.

An example of pseudo code associated with inverting the results an AND logical operation is summarized below. In this example, the pseudo code below directs an AND operation involving a data value stored in a memory cell coupled to Row 4 with a data value stored in a memory cell coupled to Row 5 (e.g., Row 4 AND Row 5) and an invert of the result of the AND operation. However, using operands for the logical AND operation from Rows 4 and 5 are merely one example, and the present disclosure is not confined to performing logical operations on operands from only these rows (e.g., data values stored in memory cells from other rows in a memory array can be used as operands for logical operations). Logical operations can be implemented using other rows than those used in the example illustration below.

Copy Row 4 into Row 1 and Row 3
    Deactivate EQ
    Sense amplifier deactivated (e.g., ACT is high, RnIF is low)
    ACTEQ signal deactivated
    Open Row 4
    Fire Sense Amplifier (e.g., activate control signals ACT and RnIF in the sense amplifier-after which Row 4 data resides in the sense amplifier)
    Close Row 4
    Activate ACTEQ signal
    Open Row 1 and Row 3
    Close Rows 1 and 3
    Precharge (e.g., deactivate control signals ACT and RnIF in the sense amplifier-activate EQ ($t_4$))
    AND Row 4 with Row 5
    Deactivate EQ
    Deactivate ACTEQ signal
    Open Row 1 and Row 3
    Close Row 1 and Row 3
    Open Row 5
    Fire Sense Amplifier
    Invert result of AND operation
    Activate ISO and INV
    Deactivate ISO
    Deactivate INV
    Activate INV
    Activate ISO
    Close Row 5 (or 6)
    Activate ACTEQ
    Precharge In the pseudo code above, "Deactivate EQ" indicates that an equilibration circuitry corresponding to the sense amplifier 206 shown in FIG. 2 is deactivated prior to $t_1$ shown in FIG. 3. Also shown is that "ACTEQ" signal is high decoupling the equilibration voltage signal ($V_{DD}/2$) from the source regions of p-channel transistors 229-1 and 229-2 prior to $t_1$ shown in FIG. 3. As was described with respect to equilibration circuitry 214 for sense amplifier 206 shown in FIGS. 2A and 2B, deactivation of the equilibration circuitry 214 occurs by equilibration signals EQ on control signal line 226 going low to turn-off transistors 225-1, 225-2, and 224 such that data lines 205-1 (D) and 205-2 (D_) are not shorted together and to an equilibration voltage (e.g., $V_{DD}/2$). Deactivation of the ACTEQ signal occurs by ACTEQ signal 218 going high to turn-off an ACTEQ equilibration transistor such that the source regions for p-channel transistors 229-1 and 229-2 are not shorted together and to an equilibration voltage (e.g., $V_{DD}/2$).

After the equilibration circuitry 214 is deactivated, and the ACTEQ equilibration transistor is deactivated, a selected row (e.g., Row 4) is enabled as indicated by "Open Row 4" in the pseudo code and as shown at $t_1$ for signal Row 4 in FIG. 3. When the voltage signal applied to Row 4 (e.g., 204-4 shown in FIG. 2) reaches the threshold voltage (Vt) of the access transistor corresponding to the selected cell, the access transistor turns on and couples the data line (e.g., 205-2 (D_)) to the selected cell which creates a differential voltage signal between the data lines. Typical word line voltage for a row can be, for example, 3.6 V when the power supply (e.g., $V_{DD}$) is 1.2 V. That is, word line activation voltage can be three (3) times the power supply voltage, for instance. Voltage above $V_{DD}$ can be implemented, for example, using charge pump circuitry. FIG. 3 shows the voltage on data line D rising slightly from the equilibration voltage level (e.g., $V_{DD}/2=1.2V/2=0.6$ V) to indicate a logic "1" being stored in the memory cell coupled to Row 4.

After Row 4 is opened, in the pseudo code above, "Fire Sense amplifier" indicates that the sense amplifier 206 is enabled, as also shown at $t_1$ in FIG. 3. Firing the sense amplifier 206 loads the Row 4 data value into the sense amplifier. The sense amplifier 206 can be enabled as described with respect to sense amplifier 206 shown in FIGS. 2A and 2B, for example, by the ACT positive control signal going low and the RnIF negative control signal going high, which amplifies the differential signal between 205-1 (D) and D_ 205-2, resulting in a voltage corresponding to a logic "1" (e.g., $V_{DD}$) or a voltage corresponding to a logic "0" (e.g., GND) being on data line 205-1 (D) (and the voltage corresponding to the other logic state being on complementary data line 205-2 (D_)). FIG. 3 shows the voltage on data line D rising to $V_{DD}$ (e.g., 1.2 V) to indicate a logic "1" being stored in the memory cell coupled to Row 4, for example. The sensed data value (e.g., Row 4) is stored in the primary latch of sense amplifier 206. The primary energy consumption occurs in charging the data lines (e.g., 205-1 (D) or 205-2 (D_)) from the equilibration voltage $V_{DD}/2$ to the rail voltage $V_{DD}$.

After firing the sense amplifiers, Row 4 is then closed as shown in the pseudo code above. At this time the ACTEQ signal 218 is activated to short the source regions of p-channel transistors 229-1 and 229-2 together and couple them to an equilibrate voltage 220 ($V_{DD}/2$). An ACTEQ equilibration transistor can be a p-channel transistor such that the ACTEQ equilibration transistor is activated by the ACTEQ signal 218 going low. Likewise the ACT signal is deactivated, going high as shown in FIG. 3.

While the ACTEQ signal remains activated, selected rows (e.g., Rows 1 and 3) are enabled as indicated by "Open Row 1 and Row 3" in the pseudo code and as shown at $t_2$ for signal Rows 1 and 3 in FIG. 3. Rows 1 and 3 are opened in a similar manner as that previously described with respect to opening Row 4. Opening Rows 1 and 3 stores the data value stored in the primary latch of the sense amplifier 206 (e.g., from Row 4) to memory cells coupled to Rows 1 and 3. If the data value is a logic "0", 0.0 Volts is stored to the memory cells of Rows 1 and 3. If the data value is a logic "1", the equilibrated voltage (e.g., 0.6 Volts) is stored to the memory cells of Rows 1 and 3 instead of a typical 1.0 or more voltage.

After the data value from Row 4 is stored into Rows 1 and 3, Rows 1 and 3 are deactivated as indicated by "Close Rows 1 and 3" and as indicated at $t_3$ in FIG. 3 for the Rows 1 and 3 signals. Closing rows can be accomplished by turning off the access transistor to decouple the selected cell from the corresponding data line.

After all rows 1 and 3 are closed, and while the ACTEQ signal remains activated, "Precharge" in the pseudo code above can cause a precharge of the data lines by an equilibrate operation, as shown in FIG. 3 at $t_4$. The equilibration operation can be initiated by the EQ control signal (on the equilibration control signal line 226 shown in FIGS. 2A and 2B) going high to turn on all transistors 225-1, 225-1, and 224 so as to short data lines 205-1 (D) and 205-2 (D_) together and to an equilibration voltage (e.g., $V_{DD}/2$). This clears the Row 4 data value from the data line 205-2 (D_) shown in FIG. 2B. The precharge is shown in FIG. 3 by the voltages on the data line D_ returning from the rail to the equilibration voltage (e.g., 0.6 V).

In the pseudo code above, "Deactivate EQ" indicates that an equilibration circuitry corresponding to the sense amplifier 206 shown in FIG. 2B is deactivated as previously described above, and as shown at $t_5$ in FIG. 3. Additionally, in the pseudo code above, "Deactivate ACTEQ" indicates that ACTEQ equilibration transistor also returns to a high ACTEQ signal to turn off the ACTEQ equilibration transistor and decoupling the source regions of p-channel transistors 229-1 and 229-2 in the sense amplifier 206 from an equilibration voltage (e.g., $V_{DD}/2$).

With the data lines D and D_ and the source regions of p-channel transistors 229-1 and 229-2 in the sense amplifier 206 equilibrated, Row 1 and Row 3 are opened again, as indicated by "Open Row 1 and Row 3" in the pseudo code and as shown at $t_6$ for signal Rows 1 and 3 in FIG. 3. Rows 1 and 3 are opened in a similar manner as that previously described (e.g., with 3.6V applied), as is shown at $t_6$ for signal Rows 1 and 3 in FIG. 3.

Opening the rows where the first operand of the AND logical operation (e.g., Row 4) data value was previously stored, and having the source regions of p-channel transistors 229-1 and 229-2 in the sense amplifier 206 equilibrated, results in the charge stored in the memory cells coupled to Rows 1 and 3 having no effect on the data line voltages (e.g., at equilibrate voltage) when the Row 4 data value stored in Rows 1 and 3 corresponds to a logic "1" because the logic "1" stored in Rows 1 and 3 is at substantially the same voltage as that to which the data line is equilibrated (e.g., 0.6V).

In contrast, however, opening Rows 1 and 3, having the source regions of p-channel transistors 229-1 and 229-2 in the sense amplifier 206 equilibrated, causes the access transistor for the memory cell coupled to Row 1 and the access transistor for the memory cell coupled to Row 3 to turn-on when the Row 4 data value corresponds to a logic "0" (which was previously stored in Rows 1 and 3). If a logic "0" is stored in the memory cell, the memory cell is discharged (e.g., 0 V). Therefore, with the word line being charged to 3.6V, the Vgs of the access device is 3.6 V−0 V=3.6 V, which is above the Vt for the access transistor it turns-on. Turning on the access transistors for the memory cells coupled to Rows 1 and 3 causes the data line voltage to decrease below the equilibrate voltage. The voltage drop is caused by the storage elements for the memory cells of Row 1 and 3 being charged by the equilibration voltage on data line, which decreases the resulting voltage of the data line D_. Effectively, the voltage on data line D_ is decreased by the effect of 2 logic zeros.

In the pseudo code above, "Close Row 1 and Row 3" indicates that Rows 1 and 3 are deactivated as previously described above for rows 1 and 3, and as shown in FIG. 3 at $t_7$. According to some embodiments of the present disclosure, any row coupled to the data lines is cancelled by closing the corresponding row line prior to opening the row to which a memory cell storing the second operand of the logical operation is stored, as described immediately below.

The row storing the second operand of the logical operation (e.g., Row 5) is enabled as indicated by "Open Row 5" in the pseudo code and as shown at $t_8$ for signal Row 5 in FIG. 3. Row 5 is opened in the same manner previously described for opening Row 3. If the Row 4 data value was a logic "1," normal sensing of the data value of Row 5 occurs. Recall, when the first operand of the AND logical operation is a logic "1," the data line remains at the equilibration voltage when Rows 1 and 3 are opened, as described above. Maintaining the data lines at the equilibration voltage enables the second operand of the AND logical operation to be sensed normally.

When the first operand of an AND logical operation is a logic "1," the result of the AND logical operation follows the value of the second operand so that if the second operand is a logic "0" the result of the AND logical operation is also a logic "0," and if the second operand is a logic "1" the result of the AND logical operation is also a logic "1." That is, when the first operand of an AND logical operation is a logic "1," the sensed data value for the second operand is also the result of the AND logical operation. The data line voltages show in FIG. 3 illustrate the first and second operands of the AND logical operation being logic "1." With Row 5 open, firing the sense amplifier drives the logic "1" voltage on the data lines to the rails, and thereby stores the result of the AND logical operation in the Row 5 memory cell, as shown after $t_8$ in FIG. 3 before Row 5 closes.

By contrast, if the Row 4 data value was a logic "0," then the result of the AND logical operation will be a logic "0" regardless of the logic state of the Row 5 data value. Recall the discussion above when Row 1 and Row 3 are opened after the Row 4 data value was stored therein, when the Row 4 data value is a logic "0," the data line voltage is decreased from the equilibrate voltage by the effect of two zeros (e.g., one in each of two memory cells, one coupled to each of Row 1 and Row 3). Therefore, the Row 5 data value is not sensed with the data line initially being at the equilibration voltage, but rather with the data line initially being below the equilibration voltage (e.g., by two logic "0" lack-of-charges).

Because of the depressed initial data line voltage for sensing the Row 5 data value, if the Row 4 data value was a logic "0," then sensing Row 5 always results in a logic "0" being sensed, regardless of what data value was stored in Row 5. If the Row 5 data value is a logic "1," the voltage on the data line will reflect the equilibrate voltage less two logic "0" data values (from Rows 1 and 3) plus the charge of the Row 5 logic "1." The net result is that the data line will reflect the equilibrate voltage minus one "0" data value. The Row 5 "1" data value effectively cancels out one of the "0" data values from Rows 1 and 3 leaving one "0" data value from Rows 1 and 3 still modifying the voltage on the data line. A logic "0" will be sensed when the sense amp 206 fires since the data line voltage is below the equilibrate voltage at sensing.

If the Row 5 data value is a logic "0," the voltage on the data line will be decreased even further from the initial voltage below the equilibrate voltage caused by the Row 1 and 3 data values. That is, the data line voltage will correspond to the equilibration voltage minus three data values of logic "0." Again, a logic "0" will be sensed when the sense amp 206 fires since the data line voltage is well below the equilibrate voltage at sensing.

As shown in FIG. 2A, the memory cell corresponding to Row 5 is coupled to data line D, as was the memory cells of Rows 1 and 3. However, the AND logical operation of the circuitry shown in FIG. 2 provides a correct result of the AND logical operation even if the second operand of the AND logical function is stored in an even Row (the memory cells of even rows being coupled to the complementary data line D_) where the charge in the memory cell storing the second operand will not affect data line D.

For example, if the second operand was stored in a memory cell coupled to Row 6, the Row 6 data value is sensed normally when the first operand of the AND logical operation (e.g., Row 4) is a logic "1," and the data lines remain at the equilibration voltage when Rows 1 and 3 are opened, as previously described.

If the first operand of the AND logical operation (e.g., Row 4) is a logic "0," the data line D voltage is depressed from the equilibration voltage when Rows 1 and 3 are opened, as described above. If the Row 6 data value is a logic "1," data line D_ reflects a voltage corresponding to the logic "1" when Row 6 is opened (e.g., greater than the initial equilibration voltage for data line D_ before Row 6 is opened), and data line D is charged to the equilibration voltage less the voltage decrease caused by the two logic "0" data values from Rows 1 and 3. Therefore, the sense amplifier 206 (when fired) compares the voltage on data line D (e.g., $V_{DD}/2$ minus the effect of two logic "0" data values from Rows 1 and 3) to the voltage on data line D_ (e.g., $V_{DD}/2$ plus the effect of one logic "1" data value from Row 6), resulting in a logic "0" being sensed (and stored into a memory cell coupled to Row 6).

If the Row 6 data value is a logic "0," data line D_ reflects a voltage corresponding to the logic "0" when Row 6 is opened (e.g., voltage below the equilibrate voltage by the effect of one logic "0" from Row 6), and data line D has a voltage equal to the equilibration voltage less the voltage decrease caused by the two logic "0" data values from Rows 1 and 3. Therefore, the sense amplifier 206 (when fired) compares the voltage on data line D (e.g., $V_{DD}/2$ minus the effect of two logic "0" data values from Rows 1 and 3) to the voltage on data line D_ (e.g., $V_{DD}/2$ minus the effect of one logic "0" data value from Row 6), resulting again in a logic "0" being sensed since data line D is at a lower voltage than data line D_. The appropriate AND logical operation result of a logic "0" (at least from the first operand being a logic "0") occurs, and is stored into a memory cell coupled to Row 6.

An invert operation can be performed on the result of the AND logical operation stored in the sense amplifier 206. The ISO and INV control lines can be activated to enable isolation transistors 243-1 and 243-2 and invert transistors 245-1 and 245-2. Enabling isolation transistors 243-1 and 243-2 and invert transistors 245-1 and 245-2 can cause the signals from nodes 233-1 and 233-2 in latch 215 to be transferred to transistors 245-1 and 245-2, respectively. At $t_9$, the ISO control line can be deactivated causing the signals from nodes 233-1 and 233-2 in latch 215 to be stored to transistors 245-1 and 245-2, respectively. At $t_{10}$, the INV control line can be deactivated causing the data line coupled to transistor 245-1 to be pulled down which inverts the signals stored in latch 215. At $t_{11}$, the INV control line can be activated after the signals stored in latch 215 have been inverted. At $t_{12}$, the ISO control line can be activated causing the inverted signals on latch 215 to be transferred to transistors 245-1 and 245-2. These inverted signals can be stored in memory cells and/or transferred to compute component 231 for further processing.

After the sense amplifier fires as described for the various scenarios discussed above, thereby storing the inverted result of the AND logical operation into the memory cell within which the second operand of the AND logical operation was previously stored, the Row 5 (or 6) is closed in a manner previously described above for other rows, as indicated in the pseudo code and as show in FIG. 3 at $t_{13}$ for signal Row 5. At $t_{13}$, the sense amplifier is deactivated and the ACTEQ equilibration transistor is activated by the ACTEQ signal 618 going low. A precharge (e.g., equilibration operation) is also initiated as previously described, as indicated in the pseudo code and shown at $t_{14}$ in FIG. 3.

While example embodiments including various combinations and configurations of sensing circuitry, sense amplifiers, memory cells of a memory array coupled to particular rows, invert circuitry, and/or shift circuitry have been illustrated and described herein, embodiments of the present disclosure are not limited to those combinations explicitly recited herein. Other combinations and configurations of the sensing circuitry, sense amplifiers, memory cells, invert circuitry, and/or shift circuitry disclosed herein are expressly included within the scope of this disclosure.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
   an array of memory cells; and
   sensing circuitry coupled to the array, the sensing circuitry comprising:
   a plurality of sensing components coupled to a controller via a number of control lines; and
   wherein the controller is configured to selectively activate a first control line and a second control line to invert signals stored on a latch, wherein the first control line is coupled to a gate of a first isolation transistor and a gate of a second isolation transistor and wherein the second control line is coupled to a source/drain region of a first invert transistor and a source/drain region of a second invert transistor.

2. The apparatus of claim 1, wherein the controller is configured to:
   activate the first control line and the second control line to transfer a first signal from the latch to a gate of a first invert transistor; and
   transfer a second signal from the latch to a gate of a second invert transistor.

3. The apparatus of claim 1, wherein the controller is configured to deactivate the first control line to:
  isolate a first invert transistor from the latch and store a first signal on a gate of a first invert transistor;
  isolate a second invert transistor from the latch and store a second signal on the gate of a second invert transistor.

4. The apparatus of claim 1, wherein the controller is configured to:
  deactivate the second control line to pull down a first data line coupled to a first invert transistor such that the first signal and the second signal invert in the latch; and wherein the first signal is on a first node in the latch coupled to a second data line and the second signal is on a second node in the latch coupled to the first data line.

5. The apparatus of claim 4, wherein the first signal enables the first invert transistor and the second signal does not enable on the second invert transistor.

6. The apparatus of claim 1, wherein the controller is configured to:
  activate the first control line and the second control line to transfer an inverted first signal from the latch to a gate of a second invert transistor and to transfer an inverted second signal from the latch to a gate of a first invert transistor.

7. An apparatus, comprising:
  an array of memory cells; and
  sensing circuitry coupled to the array of memory cells, wherein the sensing circuitry is configured to receive control signals from a controller; and
  wherein the sensing circuitry comprises:
    a first group of sensing components coupled to the controller via a first number of control lines; and
    a second group of sensing components coupled to the controller via a second number of control lines; and
  wherein the controller is configured to selectively activate at least one of the first number of control lines and the second number of control lines to invert signals stored on the first group of sensing components; and
  wherein the first number of control lines are coupled to gates of a number of first isolation transistors and gates of a number of second isolation transistors and wherein the second number of control lines are coupled to source/drain regions of a number of first invert transistors and source/drain regions of a number of second invert transistors.

8. The apparatus of claim 7, wherein the first group of sensing components comprise a latch.

9. The apparatus of claim 7, wherein the second group of sensing components comprises a first isolation transistor, a second isolation transistor, a first invert transistor, and a second invert transistor.

10. The apparatus of claim 7, wherein the second group of sensing components are configured to invert signals stored on the first group of sensing components in response to sensing signals provided to the second group of sensing components.

11. A method, comprising:
  selectively activating a first control line to send a first control signal to a first isolation transistor and a second isolation transistor;
  selectively activating a second control line to second a second control signal to a first invert transistor and a second invert transistor; and
  inverting a first data value and a second data value stored in a latch in response to deactivating the first control signal and the second control signal.

12. The method of claim 11, wherein the method further comprises sending the first control signal and second control signal simultaneously to transfer a first signal from the latch to the first invert transistor and to transfer a second signal from the latch to the second invert transistor.

13. The method of claim 11, wherein the method further comprises deactivating the first control line to store a first signal on the first invert transistor and to store a second signal on the second invert transistor.

14. The method of claim 11, wherein the method further comprises deactivating the second control line to pull down a data line coupled to the first invert transistor causing a first signal and a second signal to invert in the latch so that the first signal is on a first node in the latch coupled to a second data line and the second signal is on a second node in the latch coupled to the data digit line.

15. The method of claim 11, wherein the method further comprises activating the first control line and the second control line to transfer an inverted first signal from the latch to a gate of the second invert transistor and to transfer an inverted second signal from the latch to a gate of the first invert transistor.

16. A method, comprising:
  inverting a first signal stored on a first node of a latch and a second signal stored on a second node of the latch by deactivating a first control line coupled to a source/drain region of a first invert transistor to pull down a data line coupled to the first invert transistor causing the first signal to be stored on the second node in the latch and the second signal to be stored on the first node in the latch.

17. The method of claim 16, wherein the first node is coupled to a first data line and the second node is coupled to a second data line.

18. The method of claim 16, wherein the method further comprises storing the first signal on the first invert transistor and storing the second signal on a second invert transistor.

19. The method of claim 18, wherein the method further comprises activating a first isolation transistor and a second isolation transistor to transfer the first signal to the first invert transistor and the second signal to the second invert transistor.

20. The method of claim 18, wherein storing the first signal on the first invert transistor and storing the second signal on the second invert transistor includes deactivating a first isolation transistor and a second isolation transistor.

21. An apparatus, comprising:
  an array of memory cells; and
  sensing circuitry coupled to the array, the sensing circuitry comprising:
    a first isolation transistor coupled to a first data line and an isolation control line, a second isolation transistor coupled to a second data line and the isolation control line, a first invert transistor coupled to the first data line and an invert control line, and a second invert transistor coupled to the second data line and the invert control line, wherein the invert control line is coupled to a source/drain region of the first invert transistor and a source/drain region of the second invert transistor,
  wherein isolation control line and the invert control line is coupled to a controller configured to selectively activate the isolation control line and the invert control line to perform an invert operation on signals stored on a latch.

22. The apparatus of claim 21, wherein a first signal is stored on a first node of the latch and a second signal is stored on a second node of the latch prior to the invert operation.

23. The apparatus of claim 22, wherein the first signal is stored on the second node of the latch and the second signal is stored on the first node of the latch in response to the invert operation.

24. The apparatus of claim 21, wherein the controller is configured to activate the isolation control line and the invert control line to:
   transfer a first signal from the latch to a gate of the first invert transistor; and
   transfer a second signal from the latch to a gate of the second invert transistor.

25. The apparatus of claim 21, wherein the controller is configured to deactivate the isolation control line to:
   isolate the first invert transistor from the latch and store a first signal on a gate of the first invert transistor;
   isolate the second invert transistor from the latch and store a second signal on a gate of the second invert transistor.

26. The apparatus of claim 21, wherein the controller is configured to:
   deactivate the second control line to pull down the first data line coupled to the first invert transistor such that a first signal and the second signal invert in the latch; and
   wherein the first signal is on a first node in the latch coupled to a second data line and the second signal is on a second node in the latch coupled to the first data line.

27. The apparatus of claim 26, wherein the first signal enables the first invert transistor and the second signal does not enable on the second invert transistor.

28. The apparatus of claim 21, wherein the controller is configured to:
   activate the isolation control line and the invert control line to transfer an inverted first signal from the latch to a gate of the second invert transistor and to transfer an inverted second signal from the latch to a gate of the first invert transistor.

29. The apparatus of claim 28, wherein the inverted first signal and the inverted second signal are transferred to a compute component.

30. The apparatus of claim 28, wherein the inverted first signal and the inverted second signal are transferred off the array via an I/O line.

* * * * *